United States Patent
Sanders et al.

[11] Patent Number: 5,734,194
[45] Date of Patent: Mar. 31, 1998

[54] SEMICONDUCTOR DEVICE AND METHOD OF MAKING

[75] Inventors: Paul W. Sanders, Scottsdale; Troy E. Mackie, Chandler; Julio C. Costa, Phoenix; John L. Freeman, Jr.; Alan D. Wood, both of Mesa, all of Ariz.

[73] Assignee: Motorola, Inc., Schaumburg, Ill.

[21] Appl. No.: 792,602

[22] Filed: Jan. 31, 1997

[51] Int. Cl.$^6$ ............... H01L 27/082; H01L 27/102; H01L 29/70; H01L 31/11

[52] U.S. Cl. .............. 257/588; 257/565; 438/373; 438/532

[58] Field of Search .................. 257/565, 552, 257/554, 587, 588, 754; 438/350, 364, 365, 369, 373, 532

[56] References Cited

U.S. PATENT DOCUMENTS 5,055,427  10/1991  Haskell ........................ 437/203
5,438,007   8/1995  Vinal et al. ................... 437/41

OTHER PUBLICATIONS

C.R. Bolognesi et al., "Impact of Flourine Incorporation in the Polysilicon Emitter of NPN Bipolar Transistors", IEEE Electron Device Letters, vol. 16, No. 5, May 1995, pp. 172–174.

T. Gravier et al., "Flourine Effects in n–p–n Double–Diffused Polysilicon Emitter Bipolar Transistors", IEEE Electron Device Letters, vol. 17, No. 9, Sep. 1996, pp. 434–436.

*Primary Examiner*—Sara W. Crane
*Attorney, Agent, or Firm*—Daniel R. Collopy; Vincent B. Ingrassia

[57] ABSTRACT

A semiconductor device (10) is formed in a semiconductor substrate (11) that acts as a collector region. A base region (12) is formed in the semiconductor substrate (11) and an emitter region (52) is formed such that it contacts at least a portion of the base region (12). A conductive layer (28) is used to provide electrical connection to the emitter region (52). The portion of the conductive layer (28) above the emitter region (52) is counter-doped to address the problems of an interfacial oxide layer (27) that exists between the emitter region (52) and the conductive layer (28).

20 Claims, 4 Drawing Sheets

SEMICONDUCTOR DEVICE AND METHOD OF MAKING

BACKGROUND OF THE INVENTION

The present invention relates, in general, to semiconductor devices, and more particularly, to bipolar transistors having a relatively high breakdown voltage between the collector and emitter terminals ($BV_{CEO}$).

A common process for forming bipolar transistors includes the steps of doping an n-type semiconductor substrate, which acts as a collector terminal, with p-type dopant to form a base region. A layer of polysilicon is formed on the surface of the semiconductor substrate to provide electrical contact to an emitter region and to the base region. The emitter region is formed by doping a portion of the doped region through the layer of polysilicon with n-type dopant.

To enhance electrical contact to the base region, an additional base contact region is formed by doping the semiconductor substrate with p-type dopant through the layer of polysilicon. During subsequent high temperature processing, some of the dopant used to form the base contact region migrates through the layer of polysilicon and gathers in the layer of polysilicon in the emitter portion of the bipolar transistor. The lateral diffusion of the p-type dopant forms a minority carrier concentration gradient in the layer of polysilicon above the emitter region. The presence of this concentration gradient creates variability in the resistance of the emitter portion of the layer of polysilicon. This variability in resistance makes it more difficult to predict and control the exact performance characteristics of the bipolar transistor.

Conventional methods to compensate for this problem are directed towards increasing the gain (beta) of the bipolar transistor and reducing the breakdown voltage ($BV_{CEO}$) of the transistor. However, these solutions are not applicable when the bipolar transistor is intended for use in radio frequency (RF) power applications. These application requires relatively low beta values with high breakdown voltage and high current carrying capability.

Accordingly, a need exists to provide a method for addressing the variability in the resistance of a bipolar semiconductor device for RF power applications. It would be advantageous if the method not only improved the control of the manufacturing process, but improved the breakdown voltage of the bipolar transistor as well.

Figure 1:
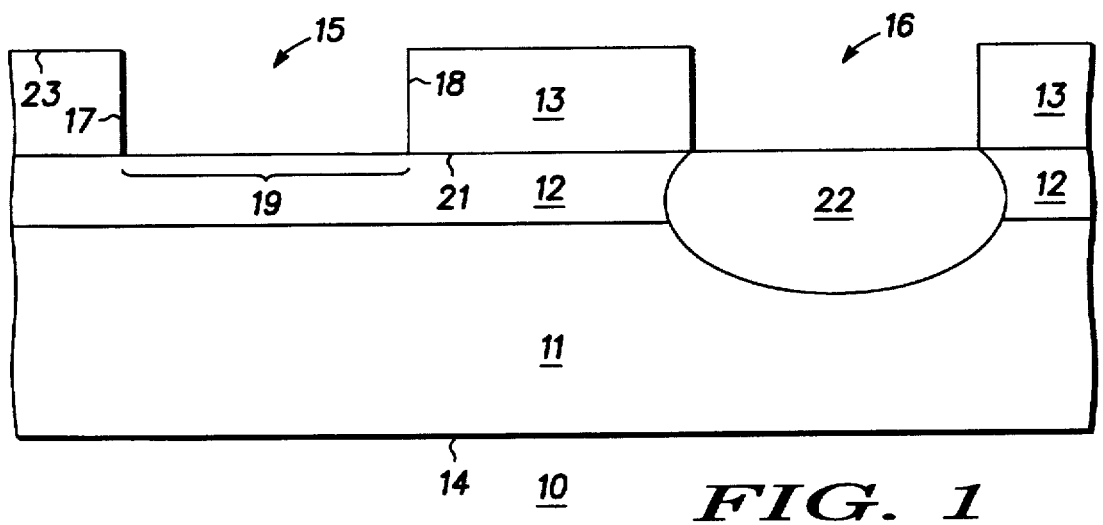
FIGS. 1 and 2 are enlarged cross-sectional views of a semiconductor device at various stages of manufacture in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIG. 1 is an enlarged cross-sectional view of a semiconductor device 10 at an early step in the manufacturing process. Semiconductor device 10 is a bipolar transistor that is described hereinbelow in an NPN configuration. This means that semiconductor device 10 has a collector and an emitter region that are of n-type conductivity that is controlled by a base region that is of p-type conductivity. This is not intended as a limitation, because as those skilled in art will appreciate, a PNP configuration can be achieved by converting p-type regions to n-type regions and vice versa.

Semiconductor device 10 is formed on a semiconductor substrate 11 that has a top surface 21 and a bottom surface 14. Semiconductor substrate 11 is of n-type conductivity and acts as the collector terminal of semiconductor device 10. In the preferred embodiment, semiconductor substrate 11 is a silicon substrate, but it should be understood that other semiconductor materials such as silicon-germanium may be used.

A base region 12 is formed by doping the top portion of semiconductor substrate 11 to p-type conductivity using either a conventional implantation or diffusion process. It should also be understood that it is possible to form base region 12 by an epitaxial growth process on semiconductor substrate 11.

A layer of dielectric material 13, hereinafter referred to as a dielectric layer 13, is then formed on the top surface 21 of semiconductor substrate 11 using either a conventional chemical vapor deposition (CVD) process, a plasma enhanced chemical deposition (PECVD) process, or other process. In the preferred embodiment, dielectric layer 13 is a single layer of silicon dioxide, but dielectric layer 13 could also be a single layer of silicon nitride or comprise a stack of dielectric layers including both silicon nitride and silicon dioxide.

Dielectric layer 13 is patterned such as is shown in FIG. 1. Preferably, a reactive ion etch (RIE) process is used to form holes 15 and 16 in dielectric layer 13, which expose the underlying top surface 21 of semiconductor substrate 11. Hole 15 has a width 19 that is defined from a first edge 17 to a second edge 18 of dielectric layer 13, and width 19 ranges from about 0.1 microns to 5 microns. An RIE etch is preferred when forming holes 15 and 16 so that the edges 17 and 18 of hole 15 are essentially perpendicular to the top surface 21 of semiconductor substrate 11 and a top surface 23 of dielectric layer 13. As will be explained in more detail below, edges 17 and 18 need not be exactly perpendicular to the top surface 21 as a wet etch process can be used to form holes 15 and 16.

Base contact region 22 is formed by implanting or diffusing p-type dopant into semiconductor substrate 11 through hole 16. By way of example, a masking layer (not shown) such as a thick (e.g., 1.0 micron) photoresist layer is formed on dielectric layer 13 such that the portion of base region 12 exposed by hole 16 is doped. A p-type dopant such as boron is implanted into the exposed portion of base region 12. Preferably, the implant is at an angle of zero degrees (i.e., semiconductor substrate 11 is perpendicular to the ion beam), but could vary from about −10 degrees to +10 degrees. A boron dose of about $5.0 \times 10^{14}$ atoms/centimeter$^2$ (cm)$^2$ to $1.0 \times 10^{17}$ atoms/cm$^2$ and an implant energy of about 20 kilo-electron volts (keV) to 150 keV is suitable to provide base contact region 22. The masking layer is then removed using appropriate techniques, and an anneal process is used to diffuse the implanted dopant into semiconductor substrate 11 such as is shown in FIG. 1. It should also be understood that base contact region 22 can be formed by a sequence of implant or diffusion steps to further improve the electrical characteristics of base contact region 22.

Figure 2:
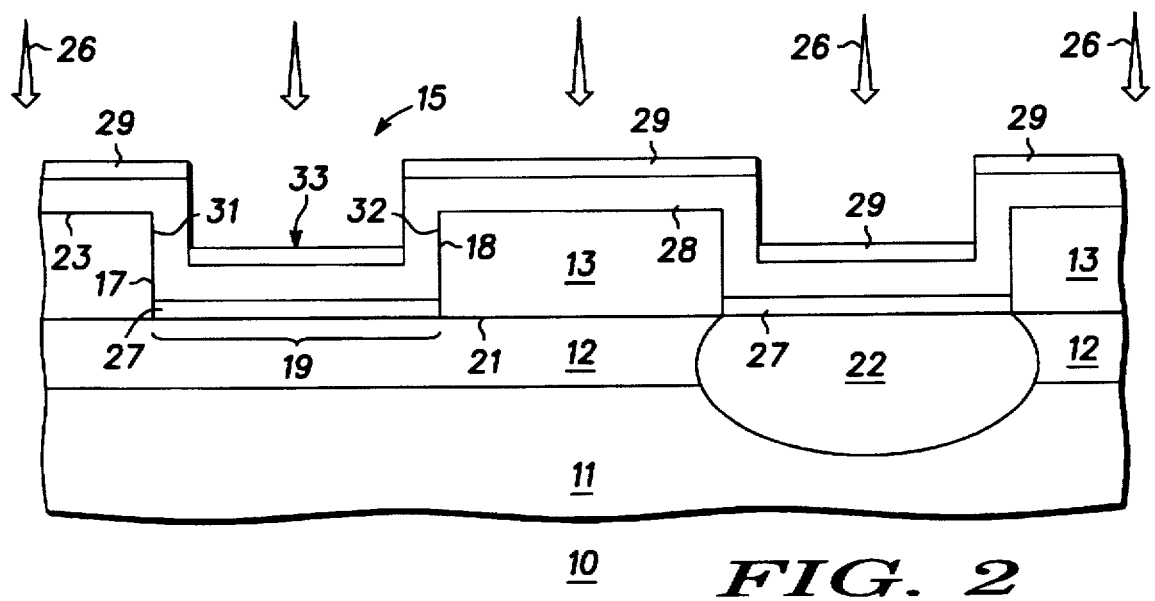

FIG. 2 is an enlarged cross-sectional view of semiconductor device 10 after further processing. As a result of previous processing of semiconductor substrate 11 in ambients that typically contain oxygen, an interfacial oxide layer 27 is formed on the top surface 21 of semiconductor substrate 11. Generally, interfacial oxide layer 27 has a thickness ranging from about 1 angstrom to 25 angstroms. The presence of interfacial oxide layer 27 can degrade the performance of semiconductor device 10 and this issue is addressed in more detail by the process steps that follow.

A layer of conductive material 28, hereinafter referred to as a conductive layer 28, such as polysilicon, silicide, or other conductive material is formed on interfacial oxide layer 27 and the top surface 23 of dielectric layer 13. For example, a CVD process can be used to deposit a layer of polysilicon onto semiconductor substrate 11 to provide conductive layer 28. Preferably, the layer of polysilicon is undoped and has a thickness ranging from about 100 angstroms to 15,000 angstroms.

In an alternate embodiment of the present invention, the deposition process of conductive layer 28 is slightly modified if conductive layer 28 is a layer of polysilicon. Prior to the deposition of the layer of polysilicon, the top surface 21 of semiconductor substrate 11 is exposed to an oxygen source to promote the formation of interfacial oxide layer 27. If done, the thickness of interfacial oxide layer 27 can be controlled to a known value, which is preferably less than 50 angstroms.

The formation of semiconductor device 10 continues with an implantation process to form counter-doped regions 29 in conductive layer 28. To do this, a blanket implant is performed across semiconductor substrate 11 without the necessity of a masking layer. A p-type dopant such as boron is implanted into the conductive layer 28 as indicated in FIG. 2 with arrows 26. Preferably, the implant is at an angle of zero degrees (i.e., semiconductor substrate 11 is perpendicular to the ion beam), but an implantation angle ranging from about −10 degrees to +10 degrees can also be used. A boron dose of about $5.0 \times 10^{12}$ atoms/cm$^2$ to $1.0 \times 10^{16}$ atoms/cm$^2$ and an implant energy of about 10 keV to 100 keV is suitable to provide counter-doped regions 29. As a result of the implant process, the surfaces of conductive layer 28 that are exposed to the ion implantation process are doped with p-type dopant.

Following the ion implantation, an annealing step is performed to activate the p-type dopant in conductive layer 28. For example, semiconductor substrate 11 is heated to about 800° Celsius (C.) to 1150° C. for about 5 minutes to 90 minutes in an inert ambient. Prior to the anneal step, the distribution of p-type dopant in conductive layer 28 is uneven. Recall that the portions of conductive layer 28 along edges 17 and 18 were not implanted when counter-doped regions 29 were formed. This is why it is preferred that holes 15 and 16 be formed with an RIE etch so that there are portions of conductive layer 28 that have a lower concentration of the p-type dopant immediately following the implantation process. The uneven distribution of p-type dopant across conductive layer 28 and the diffusion characteristics of polycrystalline materials results in a doping profile in conductive layer 28 that is unique to the present invention.

Figure 3:
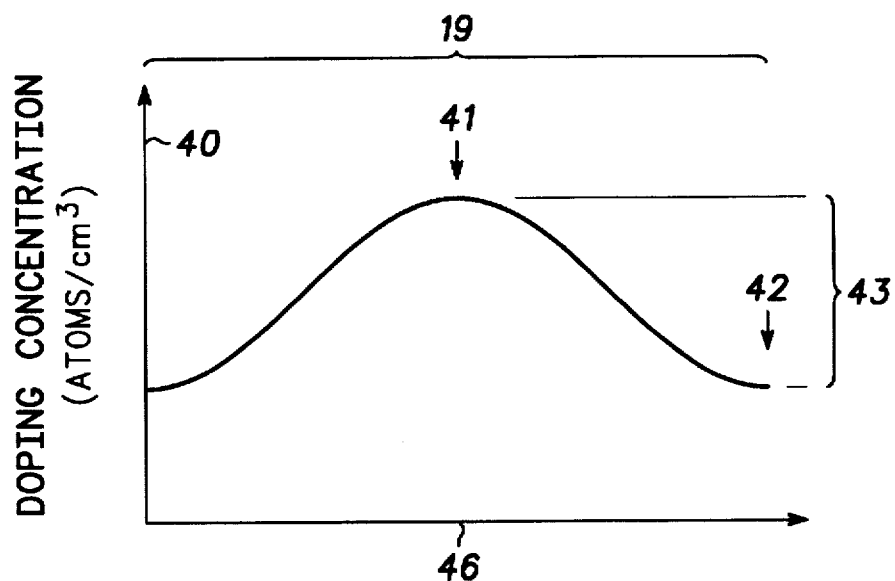
FIG. 3 is a graph demonstrating a concentration gradient in a portion of the semiconductor device in accordance with the present invention.

Turning now to FIG. 3 while still referring back to FIG. 2, a more detailed description of the doping profile formed following the anneal process is provided. FIG. 3 is a graph illustrating an example of a doping concentration or doping gradient across a portion of conductive layer 28. The portion of conductive layer 28 illustrated in FIG. 3 is the portion in hole 15 (see FIG. 2). As shown in FIG. 2, there is a portion of conductive layer 28 between edges 17 and 18. The portion of conductive layer 28 between edges 17 and 18 are denoted in FIG. 2 with edges 31 and 32, respectively. In other words, edge 31 of conductive layer 28 is juxtaposed or adjacent to edge 17 of hole 15. The same is true for edge 32 of conductive layer 28 and edge 18 of hole 15. The portion of conductive layer 28 between edges 31 and 32 has a midpoint 33 that is equidistant between edges 31 and 32.

The graph of FIG. 3 has a y-axis 40 that represents the doping concentration in atoms/cm$^3$ of the p-type dopant at various positions within conductive layer 28. The graph also has an x-axis 46 that represents the physical location within conductive layer 28 (see FIG. 2) between edges 17 and 18. The origin or leftmost portion of the x-axis 46 is the doping concentration of conductive layer 28 at edge 31. An arrow 41 is used to indicate the doping concentration of conductive layer 28 at the midpoint 33 (see FIG. 2) of conductive layer 28. An arrow 42 is used to indicate the doping concentration of conductive layer 28 at edge 32. The anneal process described above causes the p-type dopant to migrate towards the edges and remain the greatest at the midpoint 33 of conductive layer 28. As a result, the portion of conductive layer 28 near the midpoint 33 is appreciably higher than at either of the edges 31 or 32 of conductive layer 28. This difference is indicated in the graph of FIG. 3 by a bracket 43, and preferably, the doping concentration near edges 31 or 32 is at least 10 percent less than the doping concentration at the midpoint 33 of conductive layer 28. The difference in doping concentration typically ranges from about $1.0 \times 10^{18}$ atoms/cm$^3$ to $1.0 \times 10^{19}$ atoms/cm$^3$.

Figure 4:
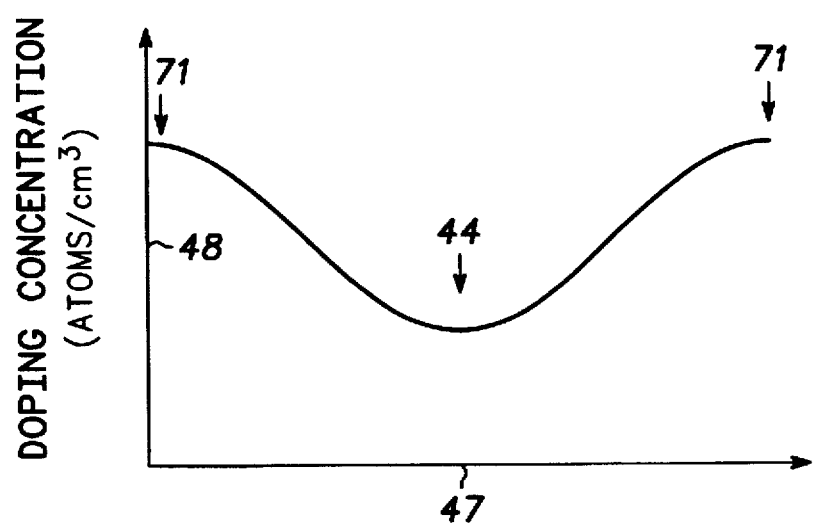
FIG. 4 is a graph showing a concentration gradient that may be found in previously known semiconductor devices.

FIG. 4 is provided as an example of a doping concentration profile present in a comparable portion of a bipolar transistor that is formed using previously known fabrication techniques. The graph has an y-axis 48, which is the p-type doping concentration across a similar conductive layer in the previously known bipolar transistor. As mentioned earlier, this p-type doping concentration results from the lateral diffusion of p-type doping from the base contact portion of the semiconductor device. The resulting concentration gradient is plotted along an x-axis 47 to show how the doping concentration varies from one edge to another.

In the processing of previously known NPN bipolar transistors, the portion of the conductive layer that forms an emitter region is only doped with n-type dopant to form the emitter region. It is well known that the emitter region should not be intentionally doped with p-type dopant, as this increases the capacitance of the emitter and degrades the performance of the bipolar transistor. In previously known bipolar transistors, a base contact region is formed away from the emitter region using p-type dopant. The diffusion properties of polysilicon allow the p-type dopant to diffuse from the base contact region and enter the emitter region. This lateral diffusion of p-type results in a signature doping pattern that is illustrated in the graph of FIG. 4. Typically, the concentration of "undesired" p-type dopant is higher at either edge (arrows 71) of the conductive layer than at the midpoint (arrow 44) of the conductive layer used to form the bipolar transistor.

In contrast to the teachings of the art, it has been discovered that by lightly counter-doping the portion of conductive layer 28 (see FIG. 2) between edges 31 and 32 with a p-type dopant, the problems created by the presence of interfacial oxide layer 27 can be addressed. Accordingly, the present invention intentionally counter-dopes conductive layer 28 as indicated in FIG. 2 to provide a structure that can be distinguished from previously known structures by the p-type doping concentration profile in this area.

Figure 5:
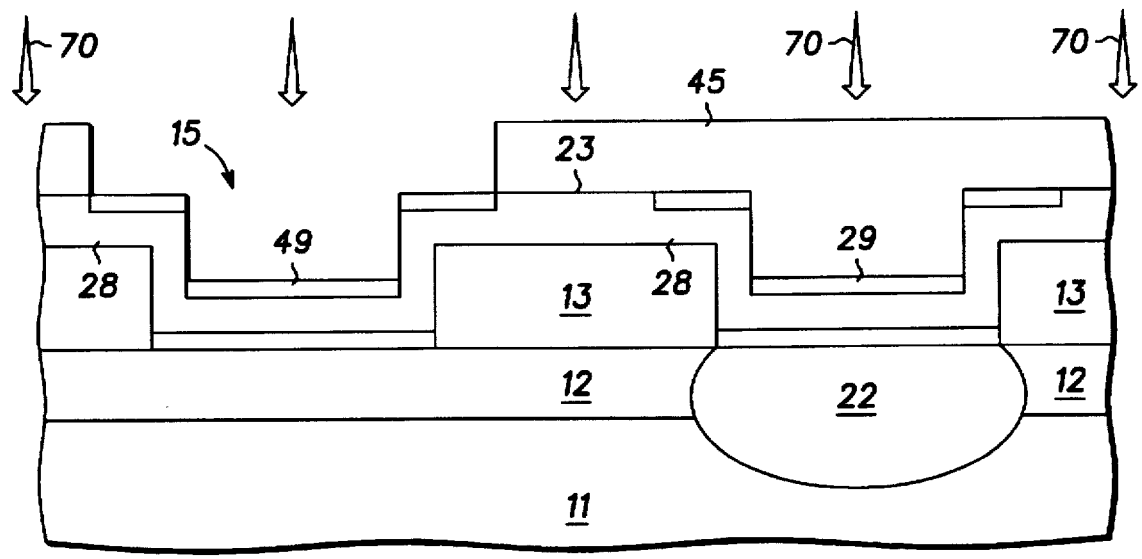
FIGS. 5–7 are enlarged cross-sectional views of the semiconductor device at various stages of manufacture in accordance with the present invention.

FIG. 5 is an enlarged cross-sectional view of semiconductor device 10 after further processing. A masking layer 45 is formed over the top surface 23 of conductive layer 28 and is patterned to provide a window that exposes the portion of conductive layer 28 around hole 15. Masking layer 45 is for example, a thick (e.g., 1.0 micron) photoresist layer, a dielectric layer, or the like. After masking layer 45 is formed, n-type doped regions 49 are formed by ion implanting an n-type dopant such as arsenic or phosphorus into the exposed portion of conductive layer 28, indicated in FIG. 5 with arrows 70 Preferably, the implant is at an angle of zero degrees (i.e., semiconductor substrate 11 is perpendicular to the ion beam), but an implantation angle ranging from about −10 degrees to +10 degrees can also be used. An arsenic dose of about $5.0 \times 10^{14}$ atoms/cm$^2$ to $1.0 \times 10^{17}$ atoms/cm$^2$ and an implant energy of about 20 keV to 150 keV is suitable to provide n-type implant regions 49. Note, the dose of this implant process to form n-type doped region 49 results in a doping concentration that is typically greater than $1 \times 10^{19}$ atoms/cm$^3$. This is greater than the doping concentration (typically, $1 \times 10^{18}$ atoms/cm$^3$) of counter-doped regions 29 (see FIG. 3). As a result, the p-type dopant that formed counter-doped regions 29 is considered minority carrier dopant and is not shown in FIGS. 5–7 for simplicity. Following the formation of n-type doped regions 49, masking layer 45 is removed using appropriate techniques to allow further processing.

Figure 6:
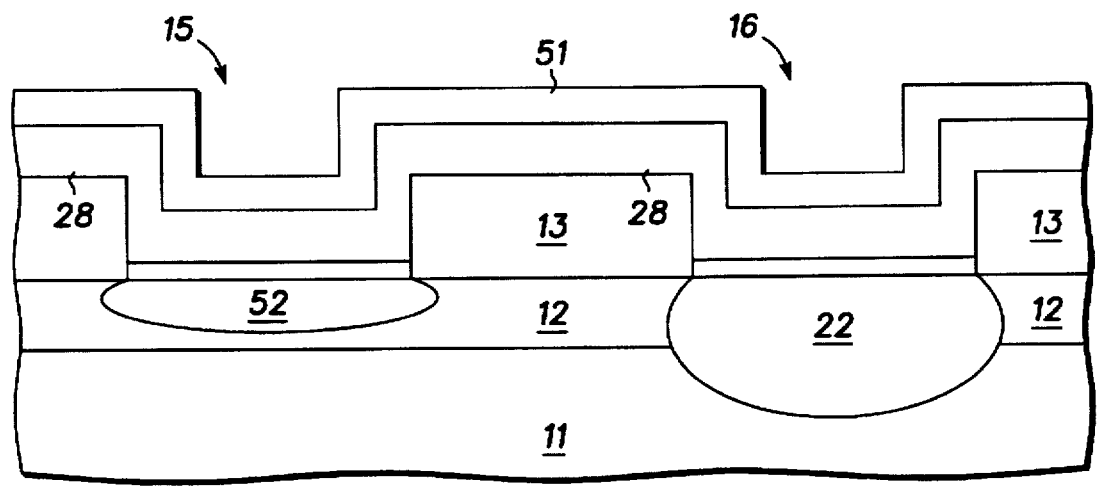

FIG. 6 is an enlarged cross-sectional view of semiconductor device 10 after further processing. A layer of silicon dioxide 51 is formed on conductive layer 28 to prevent the out-diffusion or autodoping of semiconductor device 10 during a subsequent anneal process. Semiconductor substrate 11 is then heated to activate the dopant of n-type doped region 49 (see FIG. 5). For example, semiconductor substrate 11 is heated to about 800° C. to 1150° C. for about 1 minute to 60 minutes. The anneal process forms an emitter region 52 such as is shown in FIG. 6. It should be understood that a rapid thermal process (RTP) could also be used to form emitter region 52. The layer of silicon dioxide 51 is removed using appropriate techniques to allow further processing.

Figure 7:
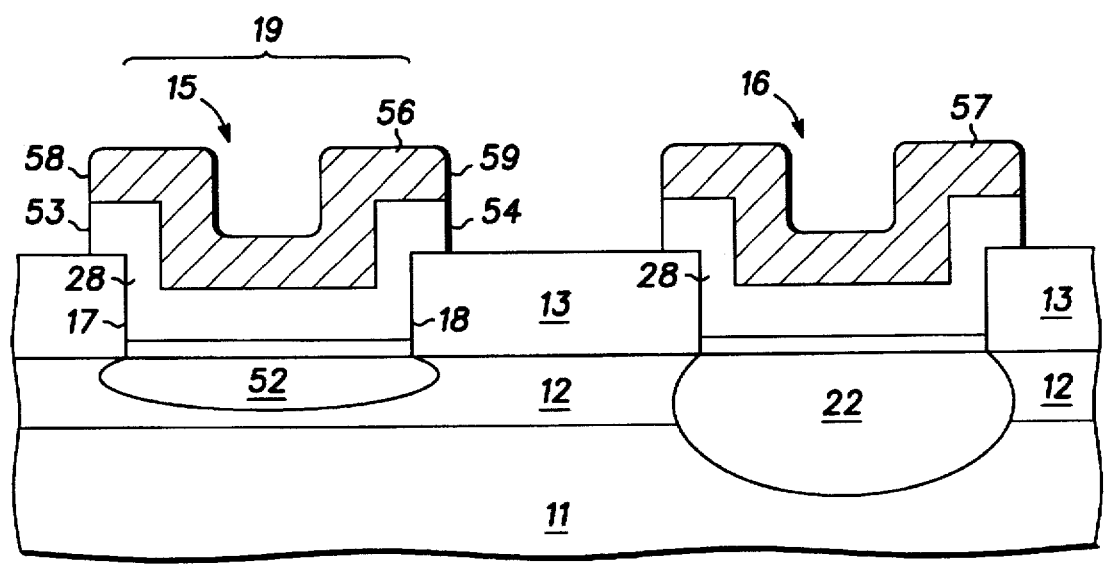

FIG. 7 is an enlarged cross-sectional view of semiconductor device 10 after further processing. A metallization layer (not shown) is formed on conductive layer 28 and is patterned to provide electrical contacts 56 and 57 as shown in FIG. 7. The metallization layer can be a single layer or a sequence of layers made from materials such as gold, copper, aluminum, titaniumtungsten, nickel, or the like. Preferably, an RIE etch is used to pattern the metallization layer to form contacts 56 and 57. Once the RIE etch has etched through the metallization layer, conductive layer 28 is etched to electrically isolate contact 56 from contact 57. In other words, the remaining portions of the metallization layer are used as a hard mask to pattern conductive layer 28, Consequently, contact 56 has edges 58 and 59 that coincide with or are aligned to edges 53 and respectively, of conductive layer 28.

The process described hereinabove, provides a bipolar transistor that is suited for RF power applications. The present invention provides a structure and process for making the structure that controls the thickness of an interfacial oxide between the base and emitter portions of the device. The process of the present invention also counter-dopes the portion of the conductive material that is used to provide electrical connection to the emitter region. These techniques provide a bipolar transistor that has a gain (beta) that ranges from about 10 to 100 and has a breakdown voltage ($BV_{CEO}$) that is greater than about 10 volts and typically ranges from about 15 volts to 50 volts. This means that a current flow injected into the base region will result in a current flow between the emitter and a collector terminal that is about 10 to 100 times larger.

In addition, the process described in the present invention provides a method for controlling the variability in the resistance of the conductive material used to provide electrical contact to the emitter region. The improvement in this variability simplifies the manufacturing process, and thus, reduces the manufacturing cost of the bipolar transistor.

We claim:

1. A semiconductor device comprising:

a semiconductor substrate of a first conductivity type, wherein the semiconductor substrate has a top surface;

a first doped region in the semiconductor substrate, wherein the first doped region is of a second conductivity type and extends from the top surface of the semiconductor substrate;

a second doped region of the second conductivity type in the semiconductor substrate, wherein the second doped region extends from the top surface of the semiconductor substrate; and a conductive material overlying at least a portion of the first doped region, the conductive material having an edge and a midpoint, wherein the conductive material has a first dopant concentration of the first conductivity type, the conductive material has a second dopant concentration of the second conductivity type, and the second dopant concentration at the midpoint of the conductive material is greater than or equal to the second dopant concentration at the edge of the conductive material.

2. The semiconductor device of claim 1 wherein the second doped region overlaps at least a portion of the first doped region and the conductive material is not overlying any of the second doped region.

3. The semiconductor device of claim 1 further comprising:

a first dielectric layer overlying the semiconductor substrate, the first dielectric layer having a first hole and a second hole that each have a first edge and a second edge, wherein the first hole is overlying the first doped region and the second hole is overlying the second doped region; and wherein the conductive material is in the first hole between the first edge and the second edge of the first hole so that the edge of the conductive material is adjacent to the first edge of the first hole.

4. The semiconductor device of claim 3 wherein the conductive material comprises polysilicon, and the first dopant concentration is greater than the second dopant concentration.

5. The semiconductor device of claim 4 further comprising a second dielectric layer between the conductive material and the top surface of the semiconductor substrate.

6. The semiconductor device of claim 5 wherein the second dielectric layer comprises silicon dioxide and is less than about 50 angstroms thick.

7. The semiconductor device of claim 6 wherein the first conductivity type is n type, the first dopant concentration is greater than about $1 \times 10^{19}$ atoms/cm$^3$, and the second dopant concentration is less than about $1 \times 10^{19}$ atoms/cm$^3$.

8. The semiconductor device of claim 7 wherein a first current flow injected into the first doped region results in a second current flow between the conductive material and the semiconductor substrate.

9. The semiconductor device of claim 8 wherein the second current flow is about 10 to 100 times greater than the first current flow.

10. The semiconductor device of claim 9 wherein the first edge and the second edge of the first hole in the first dielectric layer are essentially perpendicular to the top surface of the semiconductor substrate, and the first hole has a distance between the first edge and the second edge that ranges from about 0.1 microns to 5 microns.

11. The semiconductor device of claim 10 wherein the second dopant concentration at the midpoint of the conductive material is at least 10 percent greater than the second dopant concentration at the edge of the conductive material.

12. A method of making a semiconductor device comprising the steps of:

provided a semiconductor substrate of a first conductivity type, wherein the semiconductor substrate has a surface;

forming a first doped region of a second conductivity type in the semiconductor substrate;

forming a first dielectric layer overlying the semiconductor substrate;

forming a first hole in the first dielectric layer, the first hole having a first edge and a second edge that define a width of the first hole;

forming a first conductive material in the first hole in the first dielectric layer, wherein the first conductive material has a midpoint and a first edge that is juxtaposed to the first edge of the first hole;

doping the first conductive material with a first dopant of the second conductivity type to provide a first doping concentration in the first conductive material;

doping the first conductive material with a second dopant of the first conductivity type to provide a second doping concentration in the first conductive material, wherein the second doping concentration is greater than the first doping concentration; and annealing the semiconductor substrate such that the first doping concentration is greater at the midpoint of the first conductive material than at the first edge of the first conductive material.

13. The method of claim 12 further comprising the steps of:

forming a second hole in the first dielectric layer; and implanting the semiconductor substrate through the second hole to form a second doped region in the semiconductor substrate, wherein the second doped region is of the second conductivity type and overlaps at least a portion of the first doped region.

14. The method of claim 12 wherein the semiconductor substrate comprises a second dielectric layer that has a thickness of less than about 50 angstroms and is overlying the first doped region, and the step of forming the first conductive material includes the step of forming the first conductive material on the second dielectric layer.

15. The method of claim 14 wherein the first dielectric layer has a top surface, the step of forming the first conductive material includes the step of forming the first conductive material on the top surface of the first dielectric layer to provide a third edge and a fourth edge of the first conductive material, and the method further comprising the steps of:

forming a second conductive material overlying the first conductive material; and patterning the second conductive material to provide a first edge and a second edge of the second conductive material, wherein the third edge of the first conductive material is aligned to the first edge of the second conductive material and, the fourth edge of the first conductive material is aligned to the second edge of the second conductive material.

16. The method of claim 15 wherein the step of doping the first conductive material with the first dopant provides the first doping concentration such that the first doping concentration is less than about $1\times10^{19}$ atoms/cm$^3$, and the step of doping the first conductive material with the second dopant provides the second doping concentration such that the second doping concentration is greater than about $1\times10^{19}$ atoms/cm$^3$.

17. A method of forming a semiconductor device comprising the steps of:

providing a semiconductor substrate having a surface;

forming a first doped region in the semiconductor substrate;

forming an interfacial oxide layer on the surface of the semiconductor substrate;

forming a first conductive material on the interfacial oxide layer and overlying the first doped region, the first conductive material having a midpoint and a first edge;

implanting the first conductive material with a first dopant of a first conductivity type;

implanting the first conductive material with a second dopant of a second conductivity type; and annealing the semiconductor substrate so that the first dopant of the first conductivity type forms a concentration gradient in the first conductive material that has a higher concentration at the midpoint of the first conductive material than at the first edge of the first conductive material.

18. The method of claim 17 further comprising the steps of:

forming a dielectric layer on the surface of the semiconductor substrate, wherein the dielectric layer has a top surface;

forming a first hole and a second hole in the dielectric layer, wherein the first hole has a first edge and a second edge that are essentially perpendicular to the surface of the semiconductor substrate;

forming a second doped region by doping the semiconductor substrate through the second hole in the dielectric layer; and wherein the step of forming the first conductive material forms the first conductive material from a layer of polycrystalline material so that the first edge of the first conductive material is juxtaposed to the first edge of the first hole in the dielectric layer.

19. The method of claim 18 further comprising the steps of:

forming the first conductive material on the top surface of the dielectric layer;

forming a second conductive material overlying the first conductive material; and patterning the second conductive material to provide a first edge of the second conductive material that is aligned with a second edge of the first conductive material.

20. The method of claim 19 wherein the step of forming the second doped region forms the second doped region such that it overlaps at least a portion of the first doped region, and the step of annealing the semiconductor substrate forms a third doped region of the second conductivity type in the semiconductor substrate that overlaps at least a portion of the first doped region.

* * * * *